United States Patent [19]
Lu et al.

[11] Patent Number: 5,904,778
[45] Date of Patent: May 18, 1999

[54] SILICON CARBIDE COMPOSITE ARTICLE PARTICULARLY USEFUL FOR PLASMA REACTORS

[75] Inventors: Hao A Lu, San Mateo; Nianci Han, Sunnyvale; Gerald Z Yin, Cupertino; Robert W Wu, Pleasanton, all of Calif.

[73] Assignee: Applied Materials, Inc., Santa Clara, Calif.

[21] Appl. No.: 08/687,740

[22] Filed: Jul. 26, 1996

[51] Int. Cl.⁶ .................................................. C23C 16/00
[52] U.S. Cl. ................... 118/723 R; 156/345; 134/1.1; 315/111.21; 204/298.02; 204/298.31
[58] Field of Search ........................... 118/723 R, 723 E, 118/723 MW, 723 ME, 723 MR, 723 MA, 723 AN, 723 ER, 723 I, 723 IR; 156/345; 134/1.1; 315/111.21, 111.31, 111.41, 111.51, 111.61, 111.71; 204/298.01, 298.02, 298.31

[56] References Cited

U.S. PATENT DOCUMENTS

| | | | |
|---|---|---|---|
| 4,209,474 | 6/1980 | Prochazka | 264/29.5 |
| 4,401,689 | 8/1983 | Ban | 427/45.1 |
| 4,810,526 | 3/1989 | Ito et al. | 427/50 |
| 4,999,228 | 3/1991 | Matsumoto et al. | 428/34.4 |
| 5,085,727 | 2/1992 | Steger | 156/345 |
| 5,448,418 | 9/1995 | Hotate et al. | 359/883 |
| 5,477,975 | 12/1995 | Rice et al. | 216/68 |
| 5,578,129 | 11/1996 | Moriya | 118/719 |

FOREIGN PATENT DOCUMENTS

| | | | |
|---|---|---|---|
| 552491-A1 | 7/1993 | European Pat. Off. . | |
| 0552490 | 9/1993 | European Pat. Off. | 21/311 |
| 601468-A1 | 6/1994 | European Pat. Off. . | |
| 60-200519 | 10/1985 | Japan | 21/205 |
| 61-245558 | 10/1986 | Japan | 27/1 |
| 63-138737 | 12/1986 | Japan | H01L 21/302 |
| 03201322 | 9/1991 | Japan | 17/60 |
| 06317894 | 11/1994 | Japan | 1/14 |
| 8-17745 | 1/1996 | Japan . | |

*Primary Examiner*—Bruce Breneman
*Assistant Examiner*—Luz Alejandro
*Attorney, Agent, or Firm*—Charles Guenzer

[57] ABSTRACT

A composite silicon carbide article and its method of making in which a surface layer or film of silicon carbide is deposited, for example by chemical vapor deposition (CVD), over a free standing silicon carbide substrate, as is formed by bulk methods such as sintering and hot pressing. The article is advantageously used in a plasma reactor, especially an oxide etcher for semiconductor fabrication, and may be any of several parts including the chamber wall, chamber roof, or collar around the wafer. The bulk SiC provides an inexpensive and strong support structure of perhaps a complex shape while the CVD SiC film has advantages for plasma processing and may be tailored to particular uses. The composite SiC structure is particularly useful in that the electrical conductivities of the bulk SiC and film SiC may be separately controlled so as to provide, among many possibilities, a grounding plane, a window for RF electromagnetic radiation, or both. The ultra-high purity achieved in CVD silicon carbide also benefits the control of micro-contamination inside the reactor chamber, a key factor for increased device yield.

41 Claims, 6 Drawing Sheets

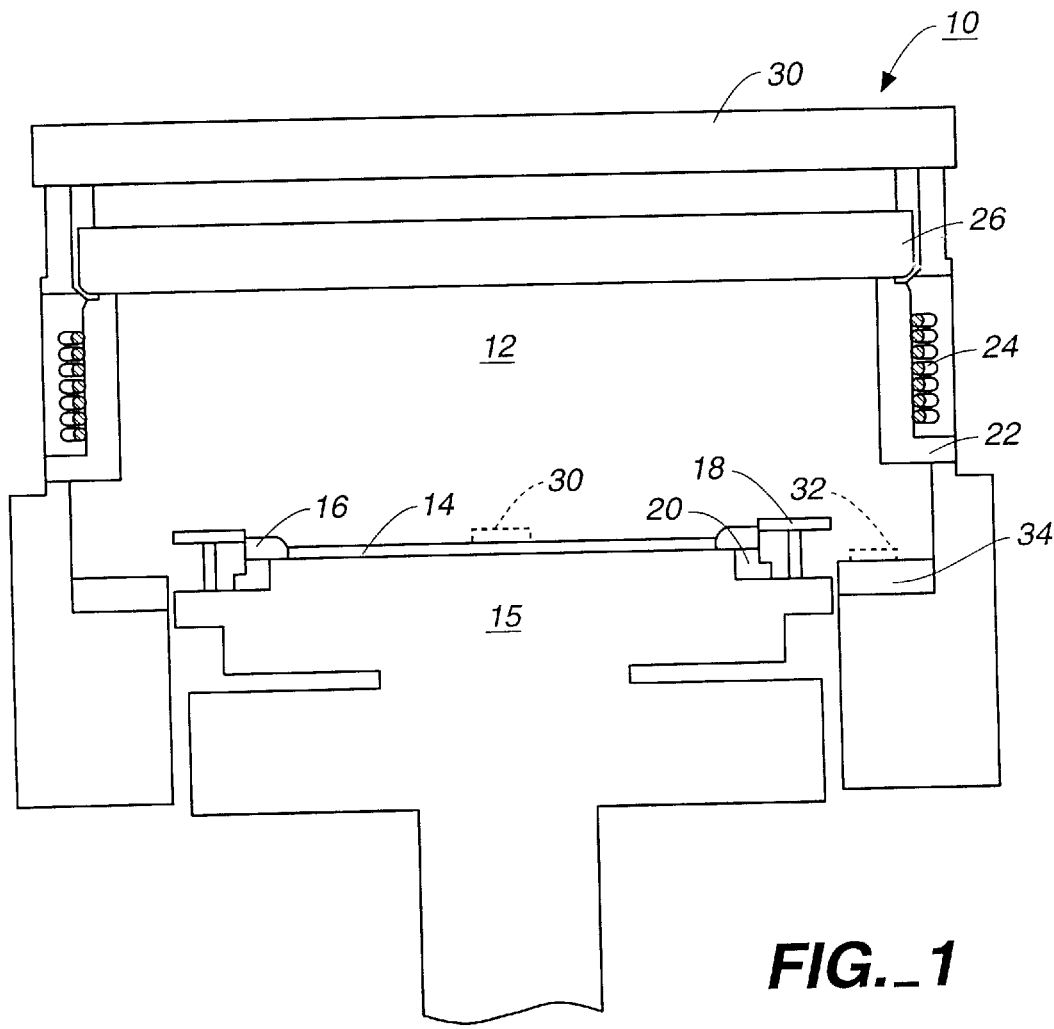
FIG._1
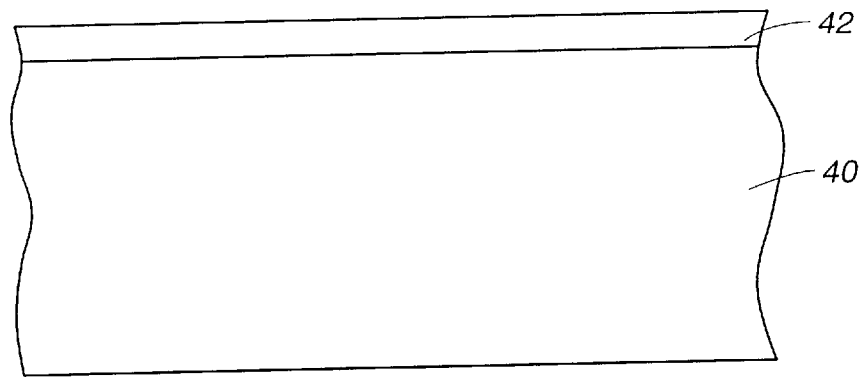
FIG._2

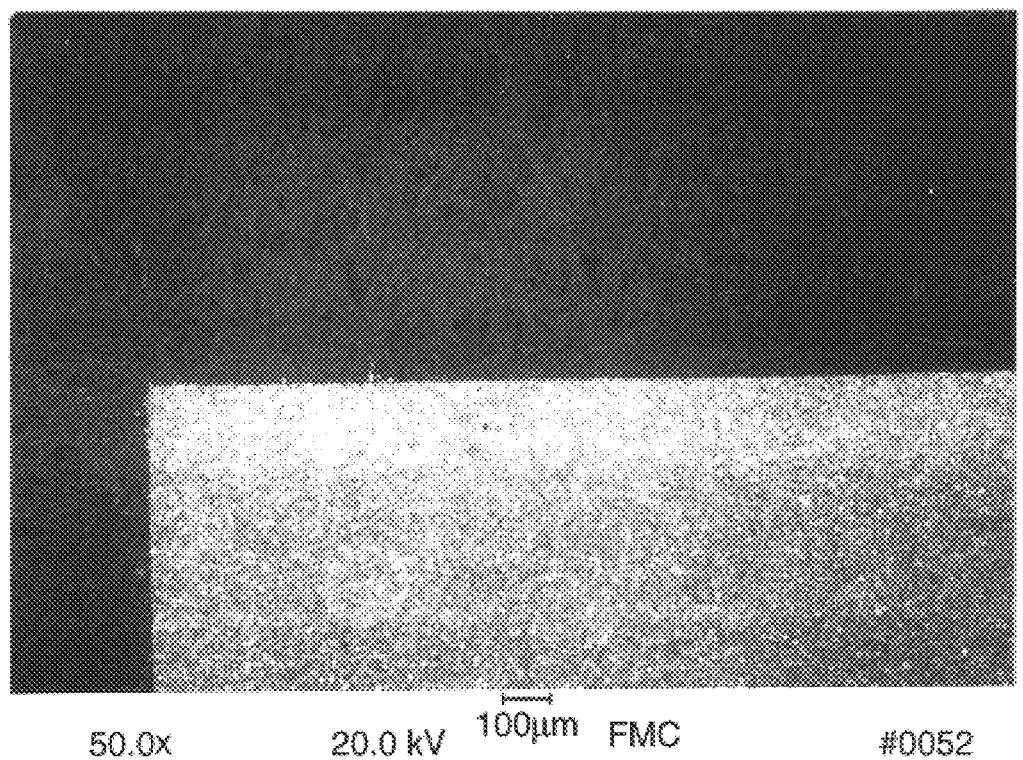
FIG._3
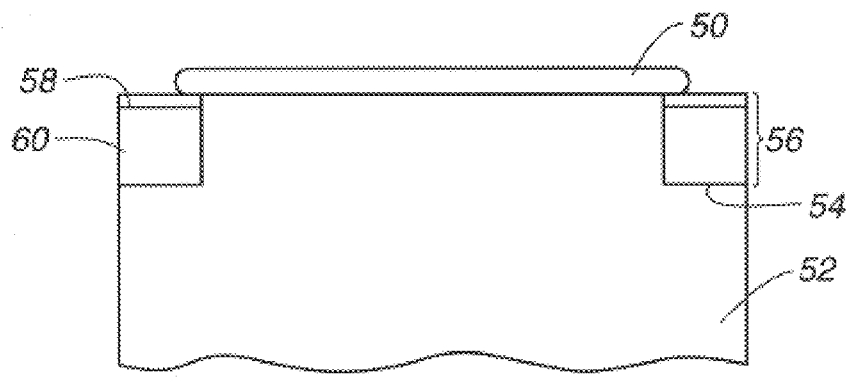
FIG._6

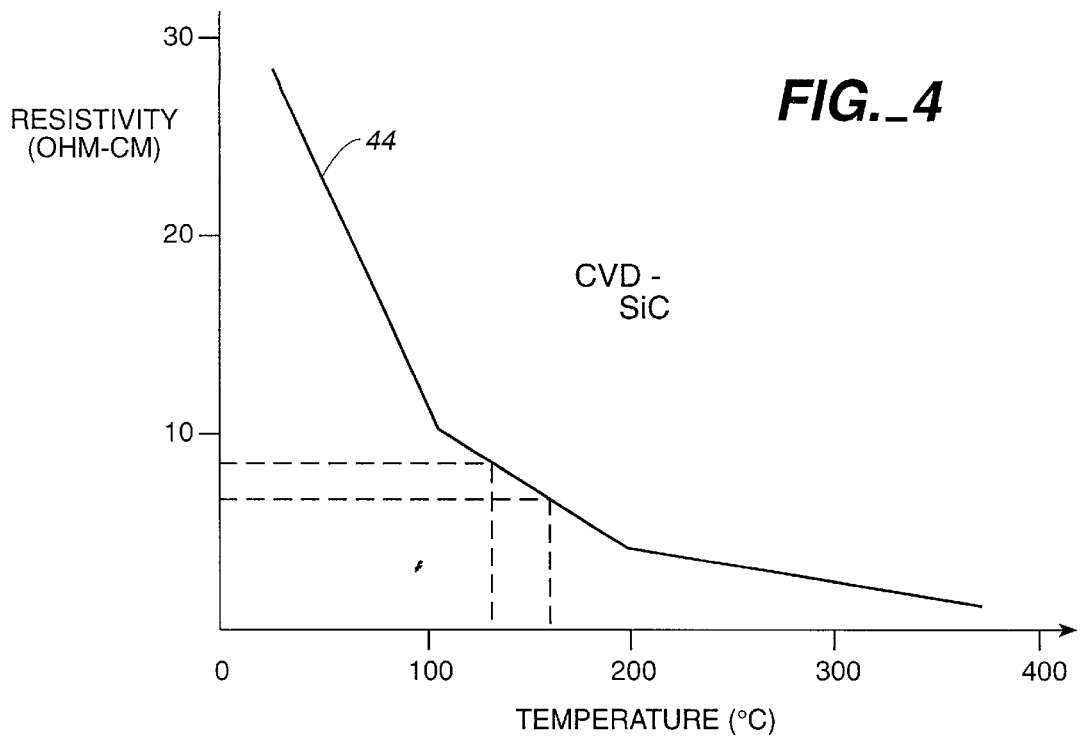
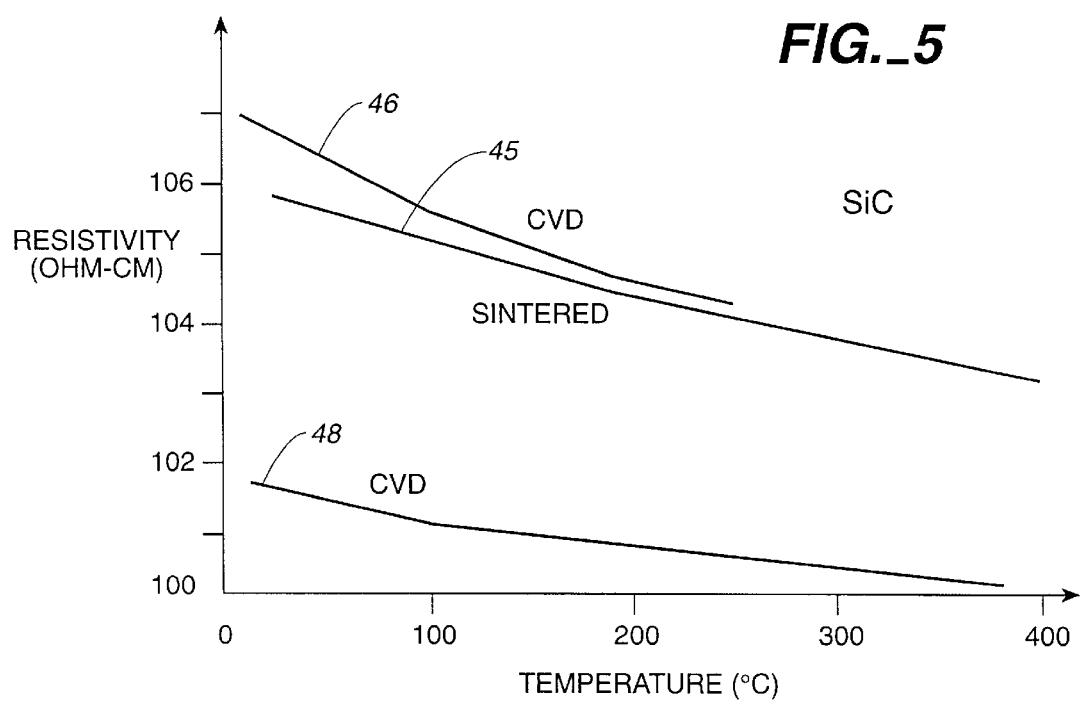

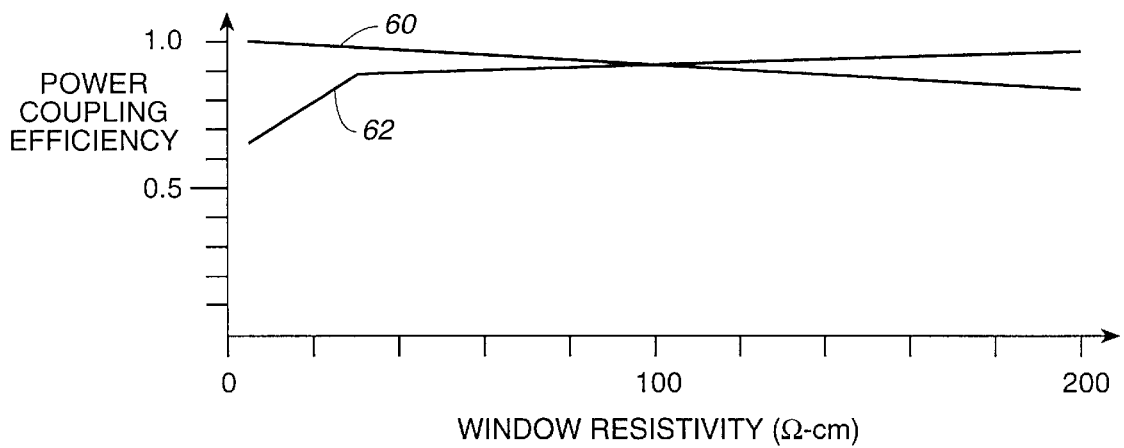
FIG._7
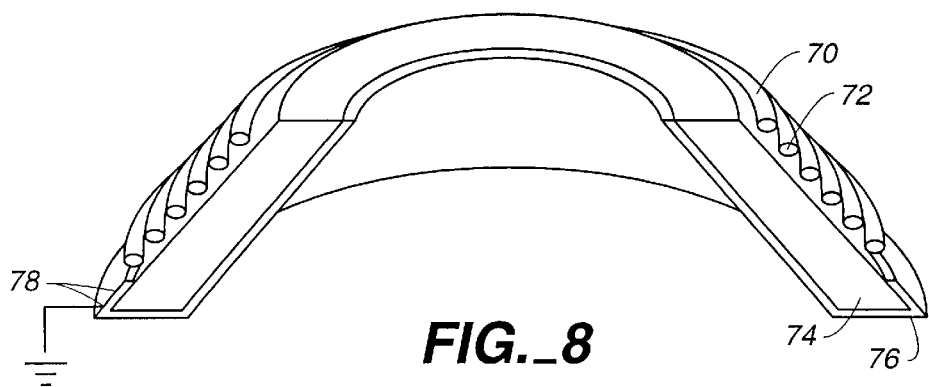
FIG._8

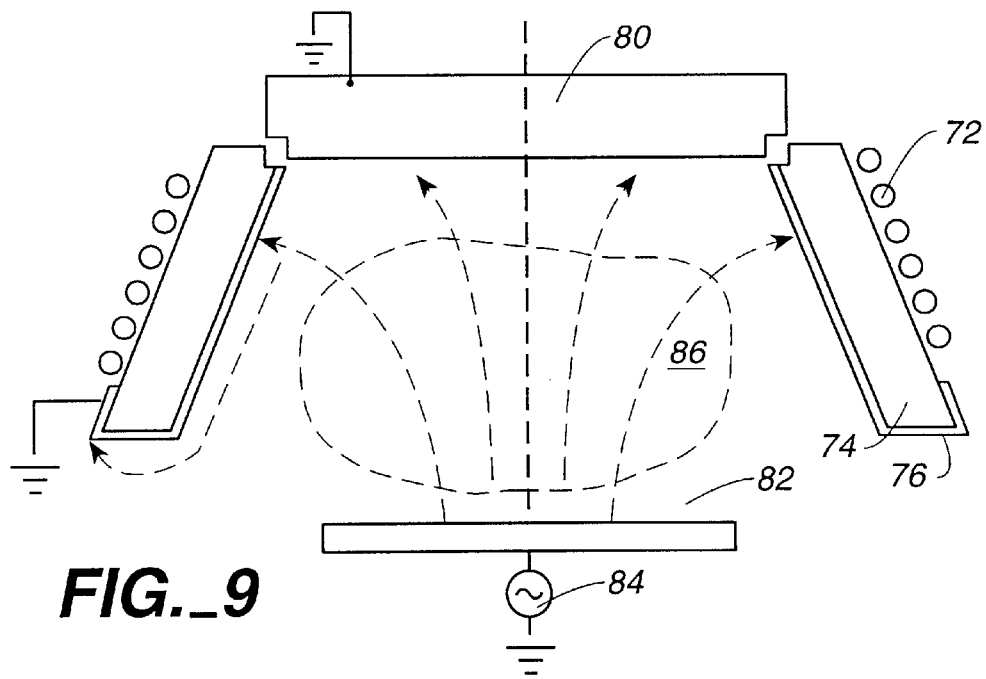
FIG._9
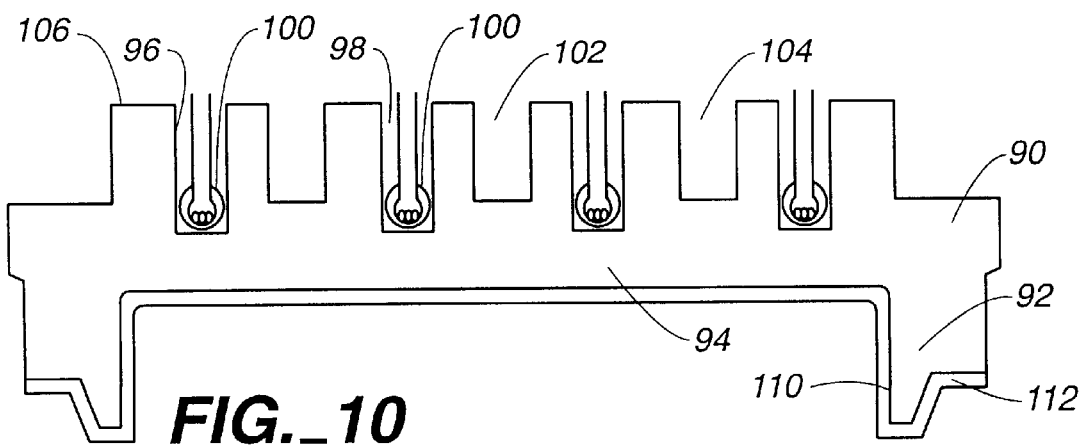
FIG._10

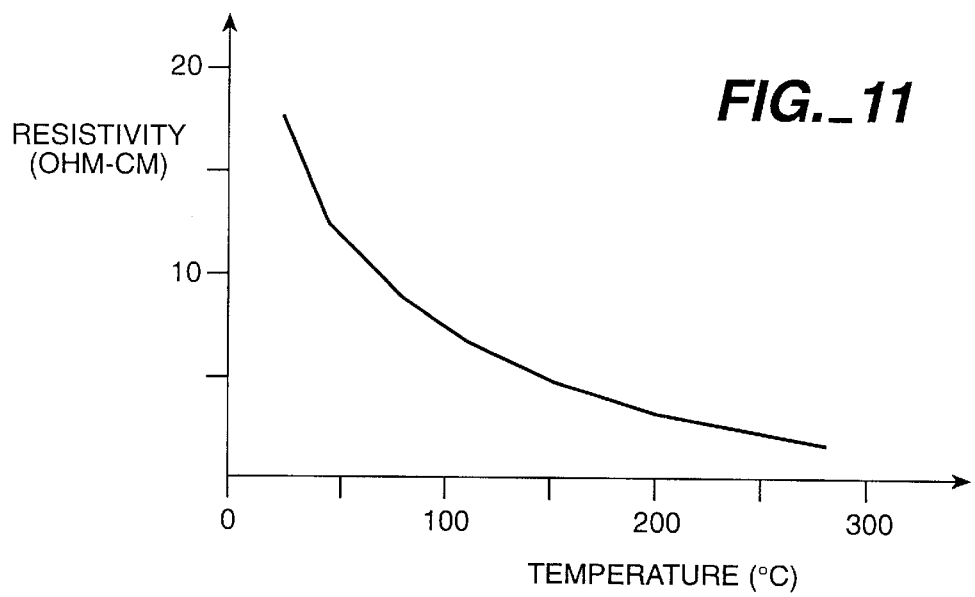
FIG._11
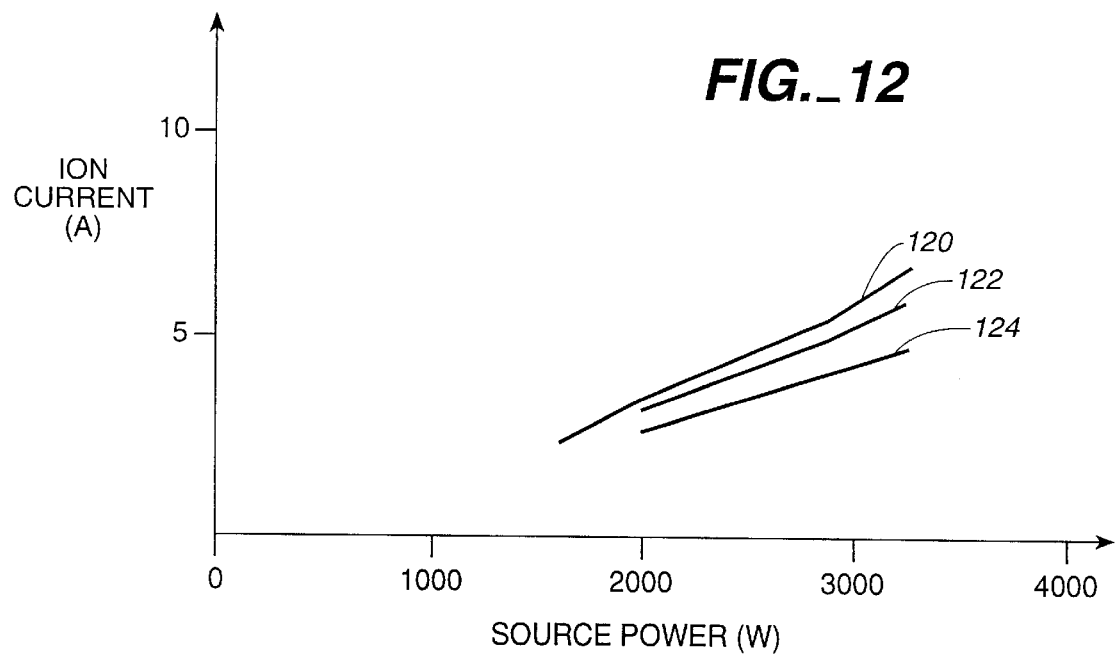
FIG._12

SILICON CARBIDE COMPOSITE ARTICLE PARTICULARLY USEFUL FOR PLASMA REACTORS

FIELD OF THE INVENTION

The invention generally relates to silicon carbide structures. In particular, the invention relates to silicon carbide composite structures having layers formed by bulk and thin-film methods.

BACKGROUND ART

Plasma reactors, for example as used in fabricating semiconductor integrated circuits, can present extreme demands upon the materials constituting the chamber walls and other components within the reactor that are exposed to the plasma. A particularly difficult environment is presented by an oxide etcher used in etching through layers of silicon dioxide in semiconductor integrated circuits.

Such a reactor is shown in schematic cross section in FIG. 1 and closely follows the Centura HDP Oxide Etcher, available from Applied Materials, Inc. of Santa Clara, Calif. This reactor is exemplary only and is described here to provide an understanding of the operation of a plasma reactor. The reactor 10 includes a vacuum chamber 12 into which is loaded a silicon wafer 14 that is supported on a pedestal 15. In the illustrated reactor, the wafer 14 is held by a plasma focus ring 16 and a clamping ring 18, and an annular plasma guard 20 surrounds the pedestal 15 to protect it from the plasma. If an electrostatic chuck is used in the pedestal 15, it may be surrounded by an unillustrated free standing collar which controls the plasma conditions in the neighborhood of the wafer 14. This description is intended to be illustrative only and not defining the preferred configuration.

The vacuum chamber 12 includes a cylindrical dielectric wall 22, outside of which is wrapped an inductive coil 24 for coupling RF energy into the chamber 12 so as to create therein a high-density plasma of processing gases admitted into the chamber 12 by unillustrated gas ports. A roof 26 defines the upper boundary of the chamber 12. The roof 26 is often grounded or even biased by an RF electrical source and thus preferably functions as a counter electrode. Alternatively or additionally, the roof 26 is preferably temperature controlled by a heater/cooler 30, which also serves as the vacuum-sealing roof, and may be electrically connected thereto so as to be commonly biased or grounded. The foregoing reactor structure is being given only by way of example so as to explain the usefulness of the invention, and the invention is equally applicable to other reactor structures and is not limited to oxide etchers.

In oxide etching, a fluorocarbon plasma, for instance of $CF_4$ or $C_3F_8$ among other examples, is used to etch through an oxide layer, typically silicon oxide overlying silicon or polysilicon. To assure uniform etching, it is important that the etching process strongly preferentially etch the oxide over the silicon. In the normal parlance, the etch should be selective to silicon.

The plasma is largely supported by the inductive coil 24, which couples a large amount of RF energy into the chamber 12 and thus generates a high-density plasma (HDP), which allows a very high etching rate of the oxide layer on the wafer 14.

However, obtaining selectivity, uniformity of selectivity over the wafer, and reproducibility of selectivity over slightly varying conditions has provided technological challenges in commercializing HDP oxide etchers. It was early recognized, as Collins et al. have described in European Patent Publication 552,491-A1, that a chamber element such as the roof 26 be formed of silicon. Under the proper conditions, the solid silicon provides species of silicon which combine with fluorine radicals in the plasma so that a fluorine-deficient carbonaceous polymer forms on the exposed elemental silicon surfaces, thereby enhancing the oxide-over-silicon selectivity. It was however also recognized that the temperature of the chamber silicon including the silicon roof 26 was important in controlling the process and that proper temperature control means for heating as well as cooling the chamber silicon should be incorporated into an oxide etcher, for example, the heater/cooler 30. It was also recognized that control of electrical biasing of the roof 26 could likewise be used to control the process.

Thereafter, attention passed to the wall 22 inside the inductive coil 24, which has been typically formed of quartz, a crystalline form of silicon oxide. Rice et al. disclose in U.S. Pat. No. 5,477,975 regulating the wall's temperature relative to that of the roof 26 to control the selectivity. It has been further recognized that other parts surrounding the wafer 14 need to have their temperature controlled to control the process. Such parts, which hitherto have been typically made of quartz, include the clamping ring 16, the plasma guard 18, and the plasma ring 20.

However, the temperature control of quartz parts is difficult. Quartz is both an electrical and thermal insulator. Its coefficient of thermal conductivity is less than 1 W/m·K, a relatively low value, so that it is difficult to closely control the temperature of the entire surface of a quartz piece exposed to the plasma. Furthermore, quartz has a chemical composition closely resembling that of the silicon oxide layer being etched in the semiconductor oxide etch reactor. Thus, one must assure that the quartz part is being operated in a deposition or slow etch mode rather than a strong etch mode while the wafer of similar composition is being strongly etched. If not, the quartz parts will have short lifetimes and hence impose a high cost of replacing consumable parts, both in terms of parts cost and machine down time. Furthermore, the quartz, although it is a silicate material providing some silicon scavenging, also produces a relatively uncontrollable amount of CO and $CO_2$ from the reaction between, for example, $CF_4$ and $SiO_2$. The resultant carbon monoxide and dioxide are particular problems for selectivity to photoresist. Also, quartz is a ceramically formed material and typically includes large amounts of non-silicate components, which become contaminants in the fluorocarbon etching environment. Even further, the etching of the quartz can undercut surface portions to the extent that particles of quartz are separated from the reactor elements and fall onto the wafer as fatal particles. Oxide etching is particularly critical against particles since the etching produces interfaces between two electrically conducting parts, one of which may be semiconducting and any particle falling on the interface before deposition of the subsequent layer can seriously affect the electrical characteristics of the junction across the interface.

Collins et al. have suggested in European Patent Application 601,468-A1 and in U.S. patent application, Ser. No. 08/597,577, filed Feb. 2, 1996 that an inductive coil be placed in back of the silicon roof 26. Further, in the latter, Collins et al. have suggested that other parts of the chamber, including the side walls 22 in front of the RF coils 24 be formed of silicon, either in its crystalline or polysilicon structure. The silicon composition provides some scavenging functions and also avoids contamination by quartz or other ceramics. However, silicon is a semiconductor, not a dielectric. As described by Collins et al., the silicon of the proper doping and thickness can advantageously also be electrically biased, either DC or RF, even while, in a preferred usage, electromagnetic radiation is being propagated therethrough. However, silicon in such uses presents many compromises and disadvantages. First, silicon in such large dimensions is not readily available at reasonable prices, particularly in times of shortage of polysilicon. Secondly, silicon, although affording relatively high structural strength, is prone to fracture from local micro-defects arising from its growth in the form of polysilicon and its subsequent machining. Thirdly, semiconducting silicon (bandgap of about 1.2 eV) affords an uneasy compromise between structural strength and electromagnetic transparency. Electromagnetic radiation can only penetrate a semiconductor or other conductor to the extent of a skin depth which can be expressed as $$\delta \approx \sqrt{\frac{\rho}{\pi \mu_0 f}}, \quad (1)$$

where f is the frequency of the electromagnetic radiation in hertz, $\mu_0$ is the magnetic permeability in H/m, and $\rho$ is the bulk DC plasma resistivity of the semiconductor in ohm-m. The penetration of electromagnetic radiation through a conductive sheet is generally an exponential function of the sheet thickness z having the general form to first order of where surface effects are disregarded. These relationships show that the transparency of a layer depends on both the material resistivity and the frequency of the electromagnetic radiation. The functional dependence (2) shows that for a thickness of no more than the skin depth, the resistive absorption is less than 64%; for a thickness of no more than one-third the skin depth, the absorption is less than 29%; and for a thickness of no more than one-tenth the skin depth, the absorption is less than 10%.

The skin depth for available semiconductor materials at reasonable operating temperatures may be considerably less than a realistic structural thickness, even for vacuum wall members. A typical inductively coupled plasma reactor uses an RF source with a frequency of 2 MHz. For this frequency and for a non-magnetic material, the estimated skin depths for representative material resistivities are given in TABLE 1

TABLE 1

| Resistivity (ohm-cm) | Skin Depth (mm) |
| --- | --- |
| 0.1 | 1.13 |
| 0.3 | 1.95 |
| 1 | 3.56 |
| 3 | 6.17 |
| 10 | 11.3 |
| 30 | 19.5 |
| 100 | 35.6 |

Many have recognized that plasma reactor chamber parts can be formed of silicon carbide, both for its high-temperature performance and for its fluorine-scavenging characteristics. However, we observe that bulk silicon carbide, at least in its sintered or hot-pressed forms, is inadequate at least in a fluorine etching environment if few particles and long part life are to be attained and if high chemical purity is required in the wafer processing chamber. Silicon carbide is sintered by mixing a silicon carbide powder with a generally pliable sintering aid. The sintering aid has a complex and ill-defined composition producing effective impurity levels on the order of hundreds of parts per million, which greatly exceed the parts-per-billion scale required for wafer processing chambers. Also, the sintering aid, even after it has been hardened in the sintering process, produces a highly granular structure that exhibits a strongly differential pattern of etching, thus becoming a mechanism for producing particulates. In contrast, in CVD SiC, the impurity levels can be controlled, if required, down to less than 100 ppb (parts per billion). Further, our experiments show that CVD SiC demonstrate uniform etch profile when being etched by a fluorocarbon etchant.

Silicon carbide is well known as a susceptor material for RF induction heating of a chamber or wafer support within the chamber. Its thermal conductivity is in the range of 100 to 200 W/m·K, vastly superior to quartz. An RF coil wrapped around the chamber induces eddy currents in a highly conductive silicon carbide part to thereby heat it to high temperatures, such as are required for thermal CVD, as disclosed by Ban in U.S. Pat. No. 4,401,689. Induction heating is to be contrasted with inductive coupling of RF power into a plasma reactor chamber. Plasma reaction chambers are usually operated at much lower temperatures, and the RF energy should be coupled into the plasma and not into chamber parts. Hence, any silicon carbide parts used in a reaction chamber, at least in the vicinity of the coils, should have relatively high electrical resistivity, for example, above $10^4$ ohm-cm.

Silicon carbide composites are well known in which a bulk piece of silicon carbide is coated with a thin film of silicon carbide using a chemical vapor deposition (CVD) or similar process. Such composites include resistive heaters, as disclosed by Ito et al. in U.S. Pat. No. 4,810,526, and rugged mirrors, as disclosed by Hotate et al. in U.S. Pat. No. 5,448,418. Matsumoto et al. in U.S. Pat. No. 4,999,288 discloses using a silicon carbide composite as a diffusion tube for heat treating semiconductor wafers at about 1200° C. According to Matsumoto et al., a 500 $\mu$m-thick silicon carbide film is CVD deposited on the interior of a reaction sintered silicon carbide tube, and the film has a low concentration of iron impurities, although this level is defined as 5 parts per million (ppm). If desired, an interfacial region in the silicon carbide tube can be depleted of silicon. Electrical resistivity is immaterial in most diffusion tubes.

SUMMARY OF THE INVENTION

The invention can be summarized as a composite silicon carbide structure and its method of making. The composite structure is particularly useful in plasma reactors used in fabricating semiconducting integrated circuits in which a gross structure of sintered or hot-pressed silicon carbide is formed into the desired shape and a thin layer of silicon carbide is deposited over the gross structure by chemical vapor deposition (CVD) or other film deposition process. The sintered silicon carbide can be easily cast or pressed into complex shapes, while the CVD silicon carbide provides a surface that is resistant to etching and to formation of particulates that can spoil the semiconductor processing.

For applications involving chamber domes and walls, the sintered silicon carbide is advantageously formed to have an electrical resistivity substantially higher than that of the film silicon carbide so as to allow electromagnetic radiation to penetrate the thick gross structure, while the SiC film can be electrically biased or provide a grounding surface for the bias current.

Other applications include members placed inside a plasma chamber to either guide the plasma or to protect other components from the plasma. These members may be silicon carbide composites of either high or low resistivity. A surface film of the composite member that is formed by CVD has a very low impurity level, of 100 parts per billion or less, so that the members do not contaminate the plasma or nearby wafer.

BRIEF DESCRIPTION OF THE DRAWINGS

FIG. 1 is side cross-sectional view of one type of plasma etching reactor in which the invention can be used.

FIG. 2 is a cross section of a product of the invention.

FIG. 3 is a micrograph of a product of the invention.

FIG. 4 is a graph of the temperature dependence of resistivity in low-resistivity sintered SiC.

FIG. 5 is a graph of the temperature dependence of resistivity of both CVD SiC and high-resistivity SiC.

FIG. 6 is cross-sectional view of a collar or focus ring incorporating the silicon carbide composite of the invention for use in a plasma reaction chamber.

FIG. 7 is a graph of coupling efficiencies through a partially conductive window.

FIG. 8 is a partially sectioned perspective view of another use of the invention in a plasma reaction chamber.

FIG. 9 is a schematical cross section of a plasma reactor using a conical composite silicon carbide dome.

FIG. 10 is a cross section of a one-piece crown dome.

FIG. 11 is a graph showing the resistivity of a silicon carbide surface film formed on bulk silicon carbide.

FIG. 12 is a graph of plasma characterization of a composite dome of the invention in comparison to two other domes.

DETAILED DESCRIPTION OF THE PREFERRED EMBODIMENTS

We have found that many plasma chamber components can be advantageously formed of a bulk, possibly shaped, member 40, shown in FIG. 2, composed of sintered or hot-pressed silicon carbide. Chemical vapor deposition (CVD) or other film deposition process is then used to coat the surface of the sintered member 40 with a relatively thin layer 42 of silicon carbide.

An example of a chamber component that can be advantageously formed by the invention is the cylindrical wall 22, shown in FIG. 1. Although generally of a cylindrical shaped, it in fact has a relatively complex shape. A complex shape is hereinafter defined as being more complex than a truncated cylinder, tube, or plate and the definition includes a radially varying, generally axially symmetric shape. Also, the overall dimensions of the chamber are relatively large, being about 15 inches (400 mm) for a chamber processing wafers of 200 mm diameter. The size problem will be exacerbated for systems handling 300 mm wafers. However, the technology of forming large, strong, shaped bodies of silicon carbide is well developed. Sintering involves the use of mixing a powder of the desired material with a sintering agent or aid, forming the mixture into a body having the desired shape, and thermally treating the body at relatively high temperatures. Sintered silicon carbide can be machined into a final shape. Hot pressing is similar to sintering but additionally includes subjecting the body to high pressures, typically uniaxial pressure, during the thermal treatment. Casting is similar to hot pressing and presses the SiC into the desirable shape. Hereinafter, sintering will be defined to include hot pressing and casting as special cases. Sintered silicon carbide is advantageous over silicon because of its strength, high thermal conductivity, and resistance to chipping. Commercial sources of hot-pressed or sintered silicon carbide are Cercom, Inc. of Vista, Calif., Carborundurn, Inc. of Costa Mesa, Calif., and Ceradyne, Inc. of Costa Mesa, Calif. Other desirable materials, such as crystalline silicon, polysilicon, and amorphous carbon, do not enjoy such advanced technology for such large members, and thus are presently expensive. Also, silicon suffers from inherently lower thermal conductivity and is subject to chipping. However, as previously mentioned, sintered silicon carbide has many characteristics that are undesirable for use within a plasma reaction chamber.

The chemical vapor deposition of silicon carbide is relatively well known, particularly in fields outside of semiconductor fabrication equipment. See, for example, U.S. Pat. No. 4,810,526 to Ito et al. and U.S. Pat. No. 5,448,418 to Hotate et al. Chemical vapor deposition involves the growth upon a substrate of a film from a gaseous precursor through a reaction which is activated, by example, thermally or by a plasma. Protective SiC carbide coatings are well known having thicknesses of 100 $\mu$m or less, but the CVD films of 1 mm or more envisioned in many of the embodiments of the inventions are believed to be novel. At the present time, several manufacturers supply free-standing CVD silicon carbide for which a relatively thick layer of at 1 to 10 mm is CVD deposited and then the underlying substrate of graphite is etched away.

Representative fabricators and suppliers of free-standing CVD SiC films are Morton International, Inc. of Woburn, Mass. and Sanzo Metal, Inc. of Tamano, Okayama, Japan. NGK Insulator, Ltd. of Nagoya, Japan can supply both sintered and CVD SiC. This same commercial CVD technology can be applied to the composite silicon carbide structure in which the substrate is left standing.

The metallurgy of silicon carbide is well explored. Its composition need not be stoichiometric and may comprise between 40 and 60 atomic % of both silicon and carbon with lesser amounts of other components. However, it is believed that stoichiometric silicon carbide exhibits the highest resistivity.

A silicon carbide composite has the further advantage over other coated materials in that the coefficients of thermal expansion for the sintered and film parts are substantially the same in contrast to, for example, SiC-coated aluminum nitride. As a result, the SiC composite can better withstand thermal stress during fabrication and use.

For parts to be used inside semiconductor plasma reactors, the CVD SiC film should have a very low impurity concentration, less than 100 ppb (parts per billion, usually expressed as atomic percentage) of metals, especially heavy metals, as measured by inductively coupled mass spectrometry, glow discharge mass spectrometry, or other similar techniques. Such pure CVD films are commercially available upon specification by the customer, but no sintered silicon carbide is known that comes close to these reduced impurity levels, the best known hot-pressed silicon carbide having an impurity level of about 100 parts per million.

Experiment 1

An important parameter for the silicon carbide or other material to be used in a plasma etching reactor, particularly one being used for oxide etching, is the etching rate of the material. A number of test coupons of various materials were prepared and placed at two positions in the reactor of FIG. 1. The first position 30 was at the center of a silicon wafer 14 supported on the pedestal 15. The second position 32 was on top of a base plate 34 of the chamber which is located outside and below the area of the wafer. The reactor was operated as an HDP oxide etcher with an etching gas of $C_4F_8$ and an argon carrier gas.

TABLE 2

| Mfgr. | Material | Type | Etch Rate ($\mu$m/hr) Base Plate | Center |
|---|---|---|---|---|
| A | SiC | CVD | 0.5 | 1.0 |
| A | SiC | CVD | 0.4 | 1.2 |
| B | SiC | CVD | 0.4 | 3.2 |
| C | SiC | hot-pressed | 0.6 | 3.2 |
| C | SiC | hot-pressed | 0.8 | 3.0 |
| D | SiC | sintered | 1.0 | 6.8 |
| E | Si | Czochralski | 1.4 | 4.6 |
| E | Si | cast | 1.3 | 10.2 |
| E | quartz |  | 2.1 | 2.4 |

All of these same samples were inspected by microscope at about a 1000×magnification prior to etching (including a pre-etch polishing) and after 30 hours of etching. The general conclusions follow. The CVD silicon carbide shows better surface morphology than sintered SiC, silicon, or quartz, and, as TABLE 2 shows, its etching rate is the lowest of these materials. The silicon shows reasonably good morphology, and its etching rate is acceptable although higher than that of CVD SiC. Sintered silicon carbide shows poor surface morphology and exhibits a non-uniform etching pattern, which may create particles and impact contamination and process control.

Experiment 2

A silicon carbide composite was fabricated in which a bulk body of sintered silicon carbide was formed having a sharp corner. The bulk body was then covered with a thick layer of up to 6 mm of silicon carbide deposited by CVD. The specimen was sectioned and inspected in both a scanning electron microscope (SEM) and in an optical microscope. The SEM micrograph is shown in FIG. 3. Several observations can be made. The sintered silicon carbide forms a matrix of generally round particles having sizes of approximately 10 $\mu$m and less. Silicon carbide can be formed to significant thicknesses by CVD. The CVD silicon carbide forms a dense structure having a crystalline orientation extending generally perpendicularly to the underlying sintered silicon carbide substrate. The CVD silicon carbide easily coats a corner having a radius of less than 20 $\mu$m, and the CVD silicon carbide exhibits the above crystalline orientation on both the horizontally and vertically extending faces around the corner. This latter results demonstrates that a layer of CVD SiC can be applied to complex shapes, such as clamping rings, collars, focus rings, etc.

A surface film of CVD SiC produces fewer particles in a plasma etch reactor than sintered SiC and many fewer than quartz. As shown by the etching data of TABLE 2, CVD SiC etches less than the other materials. More importantly, as is clear from the micrograph, CVD SiC does not have the granular structure of sintered SiC. When sintered SiC is etched, it is likely that the grain boundaries etch more quickly than the grains themselves. In some cases, the etch dynamics cause the grains to be etched free of the matrix and thus to be liberated as fairly large particles within the reactor, which are prone to fall upon the wafer being etched. Modem integrated circuits can fail if a single particle of size larger than approximately 0.2 $\mu$m falls upon it during fabrication. In contrast, the crystalline nature of CVD SiC causes it to be more uniformly etched with the etched particles being of atomic or molecular sizes. Surface profiles were measured on many of the etched samples of TABLE 2. The CVD SiC showed much smoother surface after etching than sintered SiC, quartz, and even silicon. A smoother etch indicates less propensity for particles being liberated.

Silicon carbide formed by CVD can be made much purer than sintered SiC, a particular advantage in equipment for fabricating semiconductor circuits. Coated silicon carbide can be commercially obtained with its metal impurity concentration being less than 50 to 100 parts per billion. Its silicon content is completely compatible with silicon technology, and in general its carbon content does not present major problems.

The silicon carbide composite of the invention offers several advantages for high-temperature operation. It offers very good resistance to thermal shock at temperatures at least as great as 300 or 500° C. It excels even with respect to homogeneous silicon. For the large structures allowed by the invention, silicon is available now as polysilicon, which has a tendency to chip and flake under wide temperature cycling. Silicon is a semiconductive material with a moderately narrow bandgap. Extremely pure silicon is required to achieve the desired high resistivities of greater than 10 $\Omega$-cm and preferably up to 500 $\Omega$-cm. Any variation of the impurity or doping levels or of the temperature of operation will cause significant variations in the high silicon resistivity. On the other hand, silicon carbide is a wide-bandgap semiconductor, high resistivities are easily achieved at moderate impurity levels, and further the temperature dependence of the resultant electrical conductivity is not nearly as steep as in silicon. The high-resistivity sintered silicon carbide we have tested has maintained a resistivity of greater than $10^4$ $\Omega$-cm and up to $10^5$ $\Omega$-cm at 300° C. The thickness of the CVD silicon carbide film is so thin that the thermal dependence of its electrical characteristics should not present a problem.

The silicon carbide composite of the invention is particularly advantageous over other composite structures involving multiple materials. Because its two parts are composed of substantially the same composition, the coefficients of thermal expansion of the two parts tend to be fairly equal so that thermal spalling or fracturing of a SiC composite is less of a problem.

Silicon carbide parts also have the advantage of being a source of free silicon. In plasma etching oxides with a fluorocarbon gas, selectivity over a silicon or nitride substrate can be enhanced if the counter electrode 26 is formed of silicon, which scavenges free fluorine from the plasma. The counter electrode 26 can be formed as a silicon carbide composite of the invention and will still act as a silicon source for scavenging.

Silicon carbide is further advantageous in that its electrical properties can be controlled since it is a wide-bandgap semiconductor. For example, as described above, an RF inductive coil can be placed in back of the silicon roof functioning as a counter electrode in order to provide a more uniform magnetic field across the radius of the plasma. The counter electrode must be conductive to act as an electrode, but the RF magnetic field would generate excessive eddy currents in a highly conductive counter electrode. A solution is to control the conductivity of the electrode such that the RF skin depth is less than the thickness of the member. Silicon carbide can be so controlled.

The temperature dependence is shown in trace 44 in the graph of FIG. 4 for the DC resistivity of low-resistivity CVD silicon carbide from one commercial source. Advanced oxide etchers are being designed to operate at temperatures well below 200° C., preferably around 150° C., a good range for resistivity as indicated by the dashed lines. In FIG. 5 are shown trace 45 for a high-resistivity sintered silicon carbide, and traces 46, 48 respectively for high-resistivity and low-resistivity CVD SiC. Traces 46, 48 show that for the preferred operating temperature of 150° C. resistivities of $10^5$ to $10^6$ Ω-cm are readily available in both sintered and CVD SiC. Trace 48 shows that moderately conductive CVD SiC is also available. Although low-resistivity sintered SiC is not shown, it is appreciated that its resistivity can be lowered by appropriate doping or other measures, as is well known by the commercial suppliers of such materials.

The exact mechanisms for controlling resistivity are not totally clear, but the resistivity is known to depend on the electrical dopant, such as boron, and its doping and impurity concentrations and upon the morphology and crystalline orientation, including grain size and boundary effects. Silicon carbide can form in two distinctly different crystalline phases, the α and β phases, and the semiconductor bandgaps of these two phases are different. Hot-pressed silicon carbide usually forms in the hexagonal a-phase while CVD silicon carbide tends to form in the cubic β-phase. Doping impurities ultimately determine the electrical resistivities of both forms. However, we have established several suppliers who can dependably deliver silicon carbide with widely differing but reproducible resistivities at room temperature for both sintered and CVD SiC, as shown in TABLE 3.

TABLE 3

|  | Resistivity Range at 150° C. (ohm-cm) | |
| --- | --- | --- |
|  | Sintered | CVD |
| High ρ | $10^6$ to >$10^9$ | $10^6$–$10^7$ |
| Low ρ | 1–10 | 1–50 |

It is thus seen that silicon carbide can be obtained with low resistivities below 100 Ω-cm and with high resistivities above $10^5$ and even $10^6$ Ω·cm. These ranges should be compared to silicon for which obtaining consistent and controllable resistivities above 30 Ω·cm is difficult. On the other hand, silicon can be doped to be highly conductive. These differences arise because silicon carbide can be characterized as a wide bandgap material, the bandgap being much larger than that of silicon.

We have established that high resistivity sintered SiC is available from Cercom, low resistivity sintered SiC from Norton, high resistivity CVD SiC from Sanzo Metal, and low resistivity CVD SiC from Morton Advanced Materials. NGK Insulators, Ltd. can supply both sintered and CVD silicon carbide. Listing of these sources for different materials does not imply that these sources can make only the one type of silicon carbide, and other sources may be available as well.

A further advantage of the composite SiC structure is that the electrical characteristics of the structure can be controlled and further the electrical characteristics of the two parts can be separately controlled. All the possible combinations have their own utility. The combinations are summarized in TABLE 4 and described below.

TABLE 4

| RESISTIVITY (50–200° C.) | | |
| --- | --- | --- |
| CVD SiC Coating | Bulk SiC | POSSIBLE APPLICATIONS |
| Low | Low | Electrode, RF power, Hot Ring, Focus Ring, Gas Distribution Nozzles, DC Pickup |
| High | Low | Collar, Floating Ring, Focus Ring |
| Low | High | Roof/RF, Wall |
| High | High | Collar, Floating Roof |

Low resistivity in both the film and the bulk is desirable when a composite SiC electrode is capacitively coupling high-frequency electrical energy into a plasma without additional electrical constraints. In this case, the resistivity of the composite is held as low as possible to promote low-loss RF coupling. Other applications include gas distribution nozzles, plasma focus rings, and DC pickups positioned within the chamber or on the pedestal to monitor the plasma state.

High resistivity in both the film and the bulk is desirable when the microwave or RF energy is being transmitted into a reactor chamber through a composite SiC window. Another application for a high-resistivity composite is shown in the cross-sectional view of FIG. 6 in which a wafer 50 is supported on a pedestal 52 having generally cylindrical symmetry about an axis and including a delicate electrostatic chuck on its surface. It is important to isolate the pedestal 52 from the plasma treating the wafer 50. Accordingly, a peripheral ledge 54 is formed around the top of the pedestal 52 into which is fit an insulating composite SiC collar 56 It has the form of an annulus extending about the pedestal axis, and it includes a CVD surface film 58 and a sintered bulk portion 60. Both portions 58, 60 are composed of silicon carbide and are formed to have high resistivity so as not to perturb the plasma, but the surface film 58 facing the plasma has a very low impurity concentration to contaminate the plasma processing.

High resistivity in the bulk and low resistivity in the film are desirable in the case of the previously described planar RF coil in back of a composite SiC counter electrode or wall inside the helical RF coil. The data in TABLE 1 shows that structurally thick SiC members can still pass 2 MHz electromagnetic radiation if their resistivity is about 10 Ω-cm and above. The table also shows that films of 3 mm and less can pass the 2 MHz electromagnetic radiation while still having a sheet resistance of about 1 ohm per square or less, adequate for a grounding plane or lower-frequency electrode inside an RF coil. That is, the sintered bulk SiC is made highly resistive so as to freely pass the RF magnetic field with no eddy currents while the CVD SiC thin film is made relatively highly conductive to serve as an electrode as well as be made thinner than an RF skin depth.

High resistivity in the film and low resistivity in the bulk are desirable in the case where the thin-film portion of a composite SiC wall adjacent to a plasma needs to be electrically floating but for safety reasons the bulk wall facing outwardly needs to be grounded.

Returning to the case of a conductive SiC film formed over an insulating base, RF skin depth and sheet resistance must be balanced in a member to be used as a grounded (or biased) RF window. Computer simulation is required for complex geometries interacting with a plasma. The results of one such simulation for a semiconducting window of ¾-inch (2 mm) thickness are given in the graph of FIG. 7 for a particular set of plasma conditions. These results can be scaled for other thicknesses and resistivities. The trace 60 shows the power coupling efficiency of a circular window grounded around its edges when RF power is applied to the opposed highly conductive electrode. Not unexpectedly, the efficiency falls linearly with the resistivity. Trace 72 shows the power coupling efficiency of RF energy through the semiconductor window, the RF energy being generated by an inductive coil being driven by an RF source at 2 MHz. The efficiency is highest at high resistivities and falls, probably exponentially, at lower resistivities. These results are intended as exemplary only.

A specific example is illustrated in partially sectioned perspective view of FIG. 8 showing a truncated conical dome 70 having an RF inductive coil 72 wrapped around its outside. Such a structure can form a plasma reactor chamber having several advantages over the right cylindrical chamber of FIG. 1. The conical dome 70 itself does not form part of the present invention, but was invented by another entity. However, the invention can be advantageously applied to it. The conical dome 70 is formed of a high-resistivity sintered bulk part 74 and a low-resistivity film part 76 that covers the interior of the conical dome 70, is wrapped around its bottom, and extends to a tab 78 on the outside to be electrically contacted to ground or to other electrical biasing source. The bulk part 74 has such a high resistivity as to not significantly perturb the induction field from the coil 72. The film part 76 may have a resistivity of 1–10 ohm-cm at 150° C. and a thickness of 5 mm so as to substantially pass the induction field while still providing sufficient electrical conductivity as to allow the film part 76 to present a grounding plane to the plasma within the conical dome 70.

The intended operation of the part of FIG. 8 is presented in the cross sectional view of FIG. 9. The part forms a truncated, conically shaped upper wall of a vacuum chamber, not all parts of the vacuum chamber being shown. The part is mated and sealed to a roof 80 over the chamber, preferably also of silicon carbide, either an integral or composite member, but possibly formed of polysilicon. The roof 80 may be grounded or RF biased, and in a further improvement one or more unillustrated RF inductive coils may be placed in back of the roof 80. The wafer being processed is supported on a pedestal electrode 82 which is biased by an RF power supply 84. The RF power from both the coil 72 outside the conical dome and from the pedestal electrode 82 creates a plasma 86 in the chamber. The grounding of the conductive CVD film 76 on the conical dome presents a laterally extending grounding path for the ion current from the capacitively coupled pedestal electrode 82. The conductive CVD film 76 provides another electrode in the chamber, so that, with proper insulation between the CVD film and the lower wall of the vacuum chamber, a predetermined DC bias or an AC or RF bias can be applied to the conductive CVD film 76.

It should also be clear that the composite SiC wall material of the invention is highly desirable for use as a roof, for example, as the scavenging roof 26 in FIG. 1, and for chamber wall material in plasma reactors of any configuration. Another preferred application, for example, would be in a reactor using a right circular chamber of the type generally exemplified by FIG. 1. In the chamber, for example, the wall 22 can be fabricated as a composite SiC wall and serve as a very good window for the induction field, while at the same time that SiC wall is grounded or biased. Still more importantly, the SiC composite material would be highly advantageous and a preferred material for a roof 26 over which was supported an induction antenna, especially if the roof also functions as an electrode, since this material can be optimized for both inductive window and electrical functions. A new range of combinations of inductive coupling and capacitive coupling, biasing, fluorine scavenging, and process control is accordingly now possible.

A particular advantage of the sintered SiC bulk part of the composite structure is that methods are well known to cast and machine sintered silicon carbide into large, complex structures. The top portion of the slanted two-piece chamber structure of FIG. 9 can be achieved in a fairly similar crown chamber illustrated in cross section in FIG. 10. It includes a sintered SiC support 90 of high electrical resistivity formed with a cylindrical wall portion 92 smoothly joined to a generally horizontal roof portion 94. The sintered SiC support 90 includes two deep annular grooves 96, 98 on its outer side into which are fit a number of electrically powered radiant heater lamps 100 which radiate the bottom and sides of the grooves 96, 98. The SiC support 90 has good emissive and thermally conductive properties so that the lamps 100 fit into the support 90 can effectively heat the surface of the dome exposed to the plasma. The SiC support 90 is additionally formed with a central hole 102 and another annular groove 104 to produce a mechanical structure that is generally uniform in the horizontal direction. Despite all these grooves 96, 98, 102, 104, the SiC support 90 is still formed with a planar backside 106 to which can be fit cooling plates, which can be intimately pressed against the SiC support 90 for effective thermal sinking despite any differential thermal expansion between the parts. If the radiant lamps 100 were not included, the backside 106 could be substantially planar and much thinner for even better thermal contact.

A CVD SiC film 110 is conformally coated on the interior of the crown chamber with a tab 112 extending to the exterior of the vacuum chamber for uniform electrical biasing of the inside of the chamber.

EXAMPLE

A composite SiC dome, similar to that of FIG. 9, was fabricated and electrically characterized. The sintered bulk part 74 had a thickness of between ⅜" and ¾" (10 to 20 mm) and had an electrical resistivity of $10^9$ Ω-cm at room temperature. The CVD film 74 had a thickness of 2.5 mm. A four-probe measurement determined the electrical resistivity on a free-standing coupon from the same run as the coating on the sintered part. The temperature dependence of the measured resistivity is shown in the graph of FIG. 11. The sintered bulk part as a result introduces substantially no loss for RF energy being coupled through it. The film part has a resistivity which, according to TABLE 1, produces a skin depth substantially greater than the film thickness. Hence, the film part is substantially transparent to electromagnetic radiation, but the film can still ground current from the electrode.

The conical dome was electrically and process tested together with a polysilicon roof 80. In the inventive experiment, the conical dome was the silicon carbide composite described above. In comparative experiments, the conical dome was either polysilicon (having a resistivity of greater than 20 ohm-cm) or insulating silicon carbide. Both the roof and the conical dome were grounded, although grounding the insulating SiC dome was not effective. The pedestal and coil were powered by respective RF sources.

In one set of experiments, the ion current within the chamber was measured as a function of source power, that is, the RF power applied to the coil. As shown by trace 120 in FIG. 12, an insulating silicon carbide conical dome produced the most ion current; as shown by trace 122, a grounded silicon conical dome produced an intermediate ion current; and, as shown by trace 124 the grounded composite silicon carbide conical dome produced the lowest ion current. The silicon carbide composite incurred a power penalty of 24% over insulating silicon carbide and of 15% over silicon. Encouragingly, all three ion currents behaved normally, increasing with source power and having roughly similar radial uniformities.

In another experiment, the current carried to ground by the grounded conical dome was measured as a function of bias power. For bias powers of several hundred watts, the silicon carbide composite dome produced substantially more ground current than did the silicon dome. Hence, it is concluded that the silicon carbide composite with a conductive CVD film acts as a better electrode than does the polysilicon.

The three configurations were then used to etch narrow apertures in an oxide layer using a fluorocarbon plasma etch. The processing information is still preliminary, but the results with the composite silicon carbide dome were comparable to and often better than with either the silicon dome or the insulating silicon carbide dome. The conclusion is that the composite, grounded SiC dome presents a feasible etch process that can be satisfactorily optimized.

Although the above description and examples have relied upon chemical vapor deposition for the deposition of the silicon carbide film, the invention is not so limited. Other methods may be used to deposit the film. For example, liquid-phase deposition methods can be used, especially advantageously for the thicker films contemplated for many uses of the invention. Liquid-phase epitaxy has been well developed for the deposition of semiconductor films. Sol-gel processes are also well known for depositing films.

It is understood that plasmas may be generated by means other than the illustrated inductive coils, which provide one popular method of generating high-density plasmas. The composite SiC material is equally advantageous in capacitively coupled reactors, particularly in view of the ease of providing relatively highly conductive layers to serve electrical functions, to provide biasing functions, and in oxide etch applications to provide fluorine scavenging. The CVD layer may be the powered capacitive conductive electrode, may be insulating, or may be conductive but floating so as to form a serially connected capacitive plate between the two powered plates. Plasmas may be generated by both DC and RF biased capacitive electrodes, and alternatively by electron cyclotron resonance, by remote plasma sources, by microwaves, or by yet other means. In any of these cases, the plasma is maintained within at least a portion of the plasma reaction chamber, and the composite SiC part of the invention can advantageously be used therein. Nor is the improvement confined to oxide etch or other etch applications, but rather may also be used in other applications such as CVD and PVD (physical vapor deposition). In a yet further application, microwave tubes have typically been made of quartz or other ceramic. The silicon carbide composite of the invention would provide superior performance in such an application.

The invention thus provides parts particularly useful in plasma reactors that are relatively inexpensive, easily shaped, present minimal contamination problems, can be used as silicon scavengers in fluorine etch processes, have electrical characteristics that can be advantageously controlled, and yet will enjoy a longer life and are economical consumable components. A particular advantage is the control of relative resistivity values as between the thin film portion and the bulk portion of the composite, and the large range of values possible for each allows a great improvement in the electrical flexibility, particularly in the capability of combining inductive coupling with biasing and capacitive coupling, for control of ion density and energy across large wafer diameters, and superior process control.

What is claimed is:

1. A plasma collar for being fit onto a peripheral recess in a pedestal for supporting a substrate within a plasma reaction chamber, comprising:
   a lower part comprising sintered silicon carbide; and
   an upper part comprising silicon carbide formed over said lower part.

2. The plasma collar of claim 1, wherein said upper and lower parts are formed as annuli extending about an axis and arranged along said axis.

3. The plasma collar of claim 2, wherein said upper and lower parts have respective electrical resistivities of at least $10^5$ ohm-cm.

4. A plasma reactor, comprising:
   a plasma reaction chamber having a plasma selectively generated within said chamber; and
   a composite part placed within said chamber having a sintered silicon carbide portion overlaid with a deposited silicon carbide film facing said plasma, wherein said deposited film has a metal impurity concentration of less than 100 parts per billion.

5. The plasma reactor as recited in claim 4 wherein said sintered silicon carbide portion and said deposited film have electrical resistivities differing by a predetermined amount.

6. The plasma reactor as recited in claim 5, wherein said resistivity of said sintered silicon carbide portion is higher than said resistivity of said deposited film.

7. A plasma reactor, comprising:
   a plasma reaction chamber having a plasma selectively generated within said chamber;
   a pedestal for supporting a substrate; and
   a composite part placed within said chamber having a sintered silicon carbide portion overlaid with a deposited silicon carbide film facing said plasma, wherein said composite part is formed as a ring disposed at an upper and outer periphery of said pedestal.

8. The plasma reactor as recited in claim 7, wherein said ring is fittable into a peripheral recess of said pedestal.

9. The plasma reactor as recited in claim 7, wherein both said sintered silicon carbide portion and said deposited film have resistivities of greater than $10^6$ ohm-cm at 150° C.

10. A plasma reactor, comprising:
    a plasma reaction chamber having a plasma selectively generated within said chamber; and
    a composite part placed within said chamber having a sintered silicon carbide portion overlaid with a deposited silicon carbide film facing said plasma, wherein said film has a thickness of at least 3 mm.

11. A reaction chamber, comprising:
    a wall of said reaction chamber comprising a bulk part comprising sintered silicon carbide and a film part comprising silicon carbide formed over said bulk part on a side of said wall facing an interior of said reaction chamber; and
    a source of electromagnetic radiation positioned on a side of said wall opposite said interior of said reaction chamber;

wherein said bulk part is electrically insulative such that a skin depth of said electromagnetic radiation in said bulk part is greater than a thickness of said bulk part.

12. The reaction chamber of claim 11, wherein said film part is sufficiently electrically insulative that a skin depth of said electromagnetic radiation, in said skin part, is greater than a thickness of said film part.

13. The reaction chamber of claim 11, wherein said film part has a electrically resistivity less than an electrical resistivity of said bulk part but is sufficiently large that a skin depth of said electromagnetic radiation in said film part is greater than a thickness of said film part.

14. The reaction chamber of claim 13, wherein said electrical resistivity of said film part is less than 50 ohm-cm.

15. The reaction chamber of claim 13, further comprising an electrical circuit attached to said film part.

16. The reaction chamber of claim 15, wherein said electrical circuit comprises an electrical ground.

17. The reaction chamber of claim 15, wherein said electrical circuit includes a source of an oscillating electrical signal.

18. The plasma reactor of claim 13, wherein said skin depth of said electromagnetic radiation in said bulk part is at least ten times greater than said thickness of said bulk part and said skin depth of said electromagnetic radiation in said skin part is at least ten times greater than said thickness of said film part.

19. An RF plasma reactor, comprising:
a plasma reactor chamber;
an inductive antenna positioned outside a wall of said chamber; and
a window in said chamber wall to admit the inductive field of said antenna into the interior of said chamber;
wherein said window is a composite comprising a sintered silicon carbide layer overlaid with a deposited silicon carbide film facing said interior of said chamber.

20. The plasma reactor as in claim 19, wherein said window is also an electrode.

21. The plasma reactor as in claim 19, wherein said composite is a semiconductor.

22. The plasma reactor as in claim 19, wherein said window is adapted to be connected to an RF power source.

23. The plasma reactor as in claim 19, wherein said window is adapted to be connected to an RF ground.

24. The plasma reactor as in claim 19, wherein said window is electrically floating.

25. The plasma reactor of claim 19, wherein said window is of high electrical resistivity greater than $10^6$ ohm-cm.

26. The plasma reactor of claim 25, wherein said sintered carbide layer is of high electrical resistivity greater than $10^6$ ohm-cm.

27. The plasma reactor of claim 26, wherein said deposited film is of high electrical resistivity greater than $10^6$ ohm-cm.

28. The plasma reactor of claim 19, wherein said inductive antenna is adapted to accept RF power, and wherein the thickness of said window is less than the RF skin depth.

29. The plasma reactor as in claim 28, wherein said thickness of said window is less than one-tenth the RF skin depth.

30. The plasma reactor as in claim 28, wherein said window is of high electrical resistivity.

31. The plasma reactor as in claim 28, wherein said sintered layer is of greater electrical resistivity than said deposited film.

32. The plasma reactor as in claim 28, wherein said deposited layer is thinner than said sintered film.

33. An RF plasma reactor, comprising:
a plasma reaction chamber;
a pedestal electrode for supporting a workpiece to be processed within the chamber; and
a counter electrode facing said pedestal electrode in spaced relationship thereto, said counter electrode being a composite comprising a sintered silicon carbide layer and a deposited silicon carbide film, said film facing said pedestal electrode;
wherein said electrodes are adapted to accept RF power so as to capacitively couple energy into a plasma within said reaction chamber.

34. The RF plasma reactor of claim 33, wherein a roof of said chamber comprises a metal, and wherein said counter electrode is attached thereto.

35. The RF plasma reactor of claim 34, wherein said roof functions as an anode, and wherein said pedestal electrode functions as a cathode.

36. The RF plasma reactor of claim 33, wherein said counter electrode is electrically floating.

37. The RF plasma reactor as in claim 34, wherein said counter electrode shares the same electrical potential as that of the chamber roof.

38. The RF plasma reactor of claim 33, wherein said counter electrode is of low electrical resistivity.

39. The RF plasma reactor as in claim 33, wherein said deposited film has a metal impurity concentration of less than one hundred parts per billion.

40. The RF plasma reactor as in claim 33, wherein said deposited film is much thinner than said sintered layer.

41. The RF plasma reactor as in claim 33, wherein said deposited film has a thickness of greater than 2 mm.

* * * * *